(12) United States Patent
Mori et al.

(10) Patent No.: US 11,396,716 B2
(45) Date of Patent: Jul. 26, 2022

(54) GROUP-III NITRIDE SUBSTRATE CONTAINING CARBON AT A SURFACE REGION THEREOF

(71) Applicants: OSAKA UNIVERSITY, Osaka (JP); PANASONIC CORPORATION, Osaka (JP)

(72) Inventors: Yusuke Mori, Osaka (JP); Masashi Yoshimura, Osaka (JP); Masayuki Imanishi, Osaka (JP); Akira Kitamoto, Osaka (JP); Junichi Takino, Osaka (JP); Tomoaki Sumi, Osaka (JP); Yoshio Okayama, Osaka (JP)

(73) Assignees: OSAKA UNIVERSITY, Osaka (JP); PANASONIC HOLDINGS CORPORATION, Osaka (JP)

( * ) Notice: Subject to any disclaimer, the term of this patent is extended or adjusted under 35 U.S.C. 154(b) by 19 days.

(21) Appl. No.: 16/508,223

(22) Filed: Jul. 10, 2019

(65) Prior Publication Data
US 2020/0017993 A1    Jan. 16, 2020

(30) Foreign Application Priority Data

Jul. 11, 2018 (JP) .............................. JP2018-131691

(51) Int. Cl.
*C30B 29/40* (2006.01)
*C30B 25/14* (2006.01)
(Continued)

(52) U.S. Cl.
CPC ............ *C30B 29/406* (2013.01); *C30B 25/08* (2013.01); *C30B 25/10* (2013.01); *C30B 25/14* (2013.01)

(58) Field of Classification Search
CPC ......... C30B 25/00; C30B 25/02; C30B 25/08; C30B 25/10; C30B 25/14; C30B 25/18;
(Continued)

(56) References Cited

U.S. PATENT DOCUMENTS

2002/0048964 A1* 4/2002 Yuasa ............... H01L 21/02458
438/763
2002/0189532 A1* 12/2002 Motoki ............. H01L 21/02433
117/99
(Continued)

FOREIGN PATENT DOCUMENTS

JP         4562000 B2    10/2010
JP      2015-098413 A     5/2015
(Continued)

OTHER PUBLICATIONS

Notice of Reasons for Refusal dated Mar. 1, 2022 issued in corresponding Japanese Patent Application No. 2018-131691, with English translation.

*Primary Examiner* — Kenneth A Bratland, Jr.
(74) *Attorney, Agent, or Firm* — McDermott Will & Emery LLP

(57) ABSTRACT

A group-III nitride substrate includes: a base material part of a group-III nitride including a front surface, a back surface, and an inner layer between the front surface and the back surface, wherein the carbon concentration of the front surface of the base material part is higher than the carbon concentration of the inner layer.

18 Claims, 3 Drawing Sheets

(51) Int. Cl.
*C30B 25/10* (2006.01)
*C30B 25/08* (2006.01)

(58) Field of Classification Search
CPC ..... C30B 25/183; C30B 25/186; C30B 25/20; C30B 29/00; C30B 29/10; C30B 29/40; C30B 29/403; C30B 29/406; C30B 33/00; C30B 33/005; C30B 33/02
USPC ... 117/84, 88–89, 91, 94, 99, 101, 105–106, 117/937, 952; 428/688, 689, 698–702; 252/62.3 GA
See application file for complete search history.

(56) References Cited

U.S. PATENT DOCUMENTS

| | | |
|---|---|---|
| 2016/0268129 A1 | 9/2016 | Mori et al. |
| 2017/0183776 A1* | 6/2017 | Butcher ............ C23C 16/45525 |

FOREIGN PATENT DOCUMENTS

| | | | |
|---|---|---|---|
| JP | 2015098413 A | * | 5/2015 |
| JP | 2015-207618 A | | 11/2015 |
| WO | 2015/053341 A1 | | 4/2015 |

* cited by examiner

GROUP-III NITRIDE SUBSTRATE CONTAINING CARBON AT A SURFACE REGION THEREOF

CROSS-REFERENCE TO RELATED APPLICATIONS

This application claims priority of Japanese Patent Application No. 2018-131691 filed on Jul. 11, 2018, the contents of which is incorporated herein by reference.

BACKGROUND OF THE INVENTION

1. Field of the Invention

The present disclosure relates to a group-III nitride substrate and a method of manufacturing the same.

2. Description of the Related Art

Group-III nitride crystals of GaN etc. are expected to be applied to next-generation optical devices such as high-output LEDs (light emitting diodes) and LDs (laser diodes), and next-generation electronic devices such as high-output power transistors mounted on EVs (electric vehicles) and PHVs (plug-in hybrid vehicles).

To improve performance of optical/electronic devices using group-III nitride crystals, a substrate serving as a base material is desirably made up of a high-quality group-III nitride single crystal substrate of GaN etc. To achieve higher quality of the substrate, a hydride vapor phase epitaxy (HVPE) method, an Na flux method, an ammonothermal method, etc. have been studied and developed. An oxide vapor phase epitaxy (OVPE) method using a group-III oxide as a raw material has been also devised (see, e.g., WO 2015/053341 A1). The reaction system in this OVPE method is as follows. Liquid Ga is heated, and $H_2O$ gas serving as a reactive gas is introduced in this state. The introduced $H_2O$ gas reacts with Ga to generate $Ga_2O$ gas (Formula (I) below). $NH_3$ gas is introduced and reacted with the generated $Ga_2O$ gas to generate a GaN crystal on a seed substrate (Formula (II) below).

$$2Ga + H_2O \rightarrow Ga_2O + H_2 \quad (I)$$

$$Ga_2O + 2NH_3 \rightarrow 2GaN + H_2O + 2H_2 \quad (II)$$

Among various devices, to improve the performance of vertical power devices, it is desired to reduce a resistance of a group-III nitride substrate serving as a base material. For a means of reducing the resistance, oxygen doping into a group-III nitride crystal has been devised (see, e.g., Japanese Patent No. 4562000).

However, a current substrate manufacturing method comprising mixing of impurities such as oxygen and silicon as a donor for lowering the resistance has a problem that simply mixing the impurities changes the lattice constant of the group-III nitride crystal and causes propagation of dislocation defects and cracking in a device layer at the time of a subsequent step, i.e., device layer formation, using a metal organic chemical vapor deposition (MOCVD) method etc.

SUMMARY

An object of the present disclosure is to provide a group-III nitride substrate having a low resistance and a controlled lattice constant.

One non-limiting and exemplary embodiment provides a group-III nitride substrate includes a base material part of a group-III nitride including a front surface, a back surface, and an inner layer between the front surface and the back surface, wherein the carbon concentration of the front surface of the base material part is higher than the carbon concentration of the inner layer.

The preset disclosure also provides a method of manufacturing a group-III nitride crystal includes:

reacting an oxide of a group-III element with a reducing gas, or reacting a metal of the group-III element with an oxidizing gas to generate a group-III element oxide gas;

supplying the group-III element oxide gas into a growth chamber;

supplying at least one carbon element-containing gas of $CH_4$ gas, $C_2H_6$ gas, $C_3H_8$ gas, $C_4H_{10}$ gas, $C_2H_4$ gas, $C_3H_6$ gas, $C_4H_8$ gas, $C_2H_2$ gas, and $C_3H_4$ gas into the growth chamber;

supplying a nitrogen-containing gas into the growth chamber; and reacting the group-III element oxide gas with the nitrogen-containing gas in an atmosphere of the carbon element-containing gas to generate a group-III nitride crystal, wherein from an early stage of growth to a middle stage of growth of the group-III nitride crystal, the group-III element oxide gas is generated at a high concentration as compared to a late stage of growth and is supplied at a high concentration to the growth chamber, while the carbon element-containing gas is supplied at a high concentration to the growth chamber, and wherein in the late stage of growth of the group-III nitride crystal, the group-III element oxide gas is generated at a low concentration as compared to the early to middle stages of growth and is supplied at a low concentration to the growth chamber, while the carbon element-containing gas is supplied at a low concentration to the growth chamber.

The group-III nitride substrate and the method of manufacturing the same according to the present invention can achieve both the resistance reduction and the lattice constant control of the group-III nitride substrate and can suppress propagation of dislocation defects and occurrence of cracking at the time of a subsequent step, i.e., device layer formation.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1:
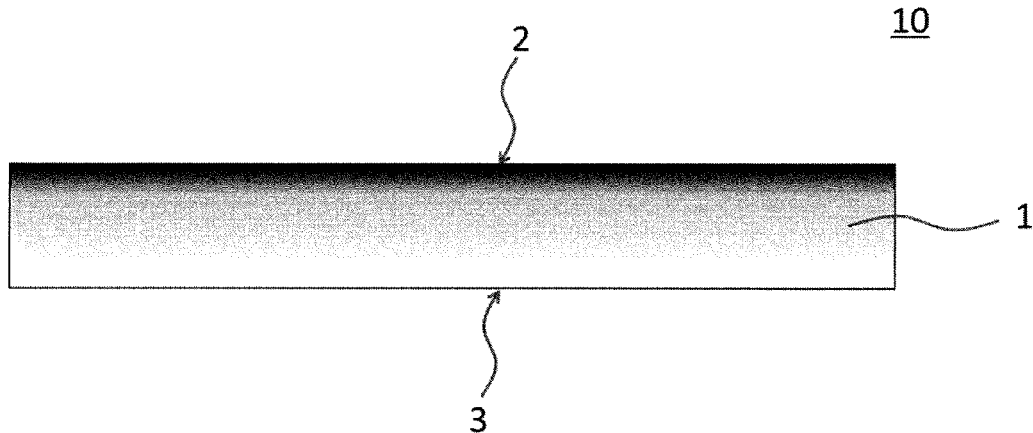
FIG. 1 is a schematic cross-sectional view of an example of a group-III nitride substrate according to a first embodiment.

A group-III nitride substrate according to a first aspect includes: a base material part of a group-III nitride including a front surface, a back surface, and an inner layer between the front surface and the back surface, wherein the carbon concentration of the front surface of the base material part is higher than the carbon concentration of the inner layer.

Further, as a group-III nitride substrate of a second aspect, in the first aspect, the front surface of the base material part may be a surface for growing a group-III nitride crystal thereon.

Further, as a group-III nitride substrate of a third aspect, in the first or second aspect, the oxygen concentration of the front surface of the base material part may be lower than the oxygen concentration of the inner layer.

Further, as a group-III nitride substrate of a fourth aspect, in the second aspect, the front surface of the base material part may be a +c surface, and the back surface of the base material part may be a −c surface.

Further, as a group-III nitride substrate of a fifth aspect, in any one aspect of the first to the fourth aspect, the carbon concentration of the front surface of the base material part may be $5 \times 10^{19}$ [atoms/cm$^3$] or more, and the oxygen concentration of the front surface of the base material part may be $1 \times 10^{20}$ [atoms/cm$^3$] or more.

Further, as a group-III nitride substrate of a sixth aspect, in the fifth aspect, the carbon concentration of the front surface of the base material part may be within a range of $1.5 \times 10^{20}$ to $5 \times 10^{20}$ [atoms/cm$^3$], and the oxygen concentration of the front surface of the base material part may be in the range of $1 \times 10^{20}$ to $1 \times 10^{21}$ [atoms/cm$^3$].

Further, as a group-III nitride substrate of a seventh aspect, in any one aspect of the first to the sixth aspect, the oxygen concentration of the base material part may be within a range of $1 \times 10^{20}$ to $1 \times 10^{21}$ [atoms/cm$^3$], and the carbon concentration of the base material part may be within a range of $1 \times 10^{17}$ to $5 \times 10^{20}$ [atoms/cm$^3$].

Further, as a group-III nitride substrate of an eighth aspect, in any one aspect of the first to the seventh aspect, the carbon concentration in the base material part gradually may change along a thickness direction from the front surface to the back surface.

Further, as a group-III nitride substrate of a ninth aspect, in any one aspect of the first to the eighth aspect, the oxygen concentration in the base material part gradually may change along the thickness direction from the front surface to the back surface.

A method of manufacturing a group-III nitride crystal of tenth aspect includes:

reacting an oxide of a group-III element with a reducing gas, or reacting a metal of the group-III element with an oxidizing gas to generate a group-III element oxide gas;

supplying the group-III element oxide gas into a growth chamber;

supplying at least one carbon element-containing gas of $CH_4$ gas, $C_2H_6$ gas, $C_3H_8$ gas, $C_4H_{10}$ gas, $C_2H_4$ gas, $C_3H_6$ gas, $C_4H_8$ gas, $C_2H_2$ gas, and $C_3H_4$ gas into the growth chamber;

supplying a nitrogen-containing gas into the growth chamber; and reacting the group-III element oxide gas with the nitrogen-containing gas in an atmosphere of the carbon element-containing gas to generate a group-III nitride crystal, wherein from an early stage of growth to a middle stage of growth of the group-III nitride crystal, the group-III element oxide gas is generated at a high concentration as compared to a late stage of growth and is supplied at a high concentration to the growth chamber, while the carbon element-containing gas is supplied at a high concentration to the growth chamber, and wherein in the late stage of growth of the group-III nitride crystal, the group-III element oxide gas is generated at a low concentration as compared to the early to middle stages of growth and is supplied at a low concentration to the growth chamber, while the carbon element-containing gas is supplied at a low concentration to the growth chamber.

Further, as a method of manufacturing a group-III nitride crystal of an eleventh aspect, in the tenth aspect, further includes:

reacting the carbon element-containing gas with a substance present in the growth chamber and containing oxygen other than the group-III element oxide gas to generate an oxide gas, and discharging the oxide gas to the outside of the growth chamber.

A group-III nitride substrate and a method of manufacturing the same according to an embodiment will now be described with reference to the accompanying drawings. In the drawings, substantially the same members are denoted by the same reference numerals.

First Embodiment

Overview of Group-III Nitride Substrate with Specified Surface Carbon Concentration and Oxygen Concentration FIG. 1 is a schematic cross-sectional view of an example of a group-III nitride substrate according to a first embodiment. This group-III nitride substrate will be described with reference to the schematic cross-sectional view of FIG. 1. As shown in FIG. 1, a group-III nitride substrate 10 has a base material part 1 made of a group-III nitride having a front surface 2 and a back surface 3 and is characterized in that the front surface 2 has a carbon concentration controlled to a higher concentration as compared to an inner layer of the base material part 1. It is noted that the base material part 1 may correspond to a part of the group-III nitride substrate, or the base material part 1 may correspond to the whole of the group-III nitride substrate.

Controlling the carbon concentration of the front surface 2 in this way makes a reduction in resistance and control of lattice constant possible, so that lattice mismatch with a device layer formed on the front surface 2 side can be reduced. By making the carbon concentration of the front surface higher, the lattice mismatch with the device layer formed on the front surface 2 can be suppressed, and the resistance of the group-III nitride substrate 10 can be made smaller. On the other hand, the carbon concentration in the inner layer is lowered so as to restrain carbon from acting as an acceptor and causing a reduction in electrical conductivity of a crystal.

Oxygen may be mixed at a higher concentration throughout the front surface 2 to the back surface 3 of the base material part 1 as compared to a group-III nitride crystal (oxygen concentration: $10^{17}$ atoms/cm$^3$ or less) produced by a common manufacturing method, i.e., an HVPE method (it is noted that a concentration difference is made as described above in comparison between the front surface 2 and the inner layer of the base material part 1).

This can make the overall resistance of the group-III nitride substrate 10 extremely small. Furthermore, the base material part 1 of the group-III nitride substrate 10 according to this embodiment may have the front surface 2 that is a +c surface (e.g., when the base material part 1 is GaN, the front surface 2 may be a Ga-polar surface) and the back surface 3 that is a −c surface (e.g., when the base material part 1 is GaN, the back surface 3 may be an N-polar surface). When the front surface 2 is a +c surface, a higher-quality group-III nitride crystal can be grown on the front surface 2.

Figure 2:
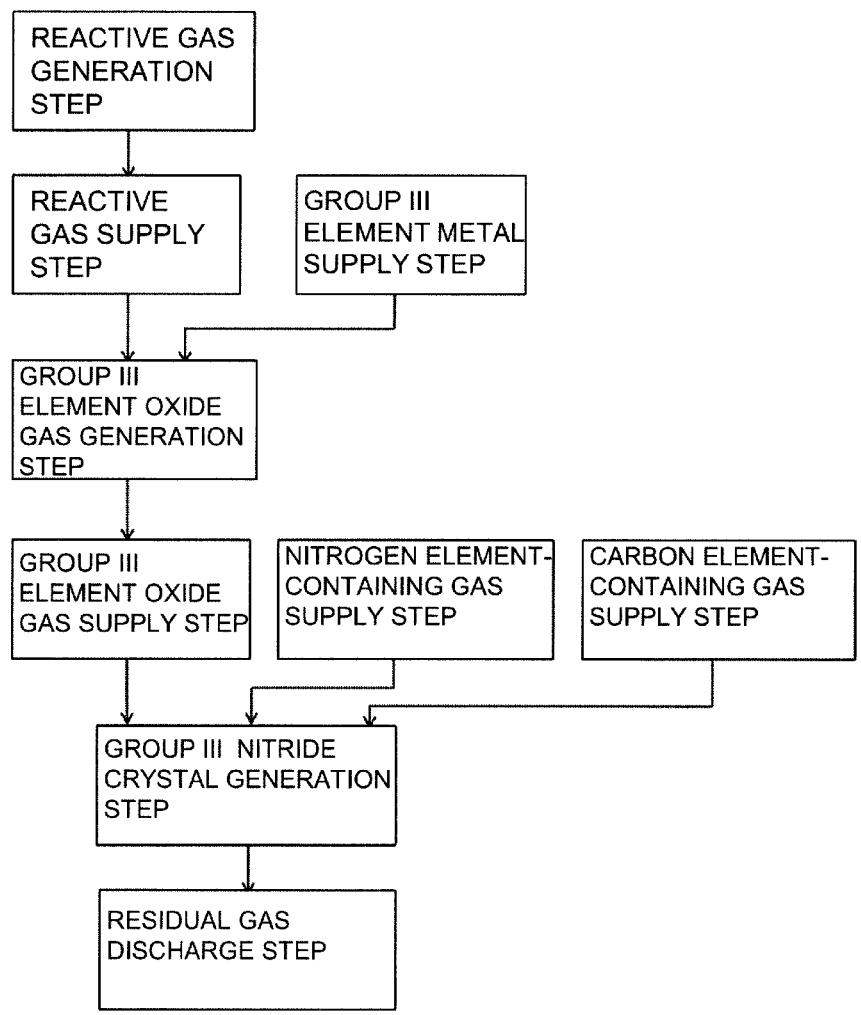
FIG. 2 is a diagram showing a flowchart of a group-III nitride crystal manufacturing method according to the first embodiment.

Overview of Method of Manufacturing Group-III Nitride Crystal with Specified Surface Carbon Concentration and Oxygen Concentration An overview of a method of manufacturing the group-III nitride substrate according to the first embodiment will be described with reference to a flowchart of FIG. 2.

The method of manufacturing the group-III nitride crystal according to the first embodiment comprises a reactive gas generation step, a reactive gas supply step, a group-III element metal supply step, a group-III element oxide gas generation step, a group-III element oxide gas supply step, a nitrogen element-containing gas supply step, a carbon element-containing gas supply step, and a group-III nitride crystal generation step. The method may further comprise a residual gas discharge step.

At the group-III element oxide gas generation step, a group-III element metal serving as a starting group-III element source is reacted with a reactive gas supplied at the reactive gas supply step to generate a group-III element oxide gas. The generated group-III element oxide gas is supplied into a growth chamber (the group-III element oxide gas supply step). As a result, mixing of oxygen into the crystal can be controlled at a high concentration. Details of the concentration control will be described later.

Additionally, if the supply of the reactive gas is unstable, the reactive gas generation step may be performed (e.g., $H_2O$ gas is generated from the reaction of $H_2$ gas and $O_2$ gas). A reactive gas generated in this generation step is reacted with a group-III element liquid metal that is the starting group-III element source.

Furthermore, the group-III element metal supply step may be performed to improve the productivity. At the supply step, a desired amount of additional group-III element metal is appropriately supplied into a raw material container holding the group-III element metal disposed in a raw material chamber.

At the nitrogen element-containing gas supply step, a nitrogen element-containing gas is supplied to the growth chamber.

At the group-III nitride crystal generation step, the group-III element oxide gas supplied into the growth chamber at the group-III element oxide gas supply step is reacted with a nitrogen element-containing gas supplied into the growth chamber at the nitrogen element-containing gas supply step to manufacture a group-III nitride crystal.

At the carbon element-containing gas supply step, a carbon element-containing gas is supplied to the growth chamber. As a result, mixing of carbon into the crystal can be controlled at a high concentration. Details of the concentration control will be described later. Another effect of the supply of the carbon element-containing gas is that an oxide other than the group-III element oxide gas supplied into the growth chamber is reacted with the carbon element-containing gas to suppress mixing of oxygen into the crystal due to the oxide other than the group-III element oxide gas into the group-III nitride crystal. This enables high quality crystal growth with abnormal growth such as polycrystallization suppressed.

At the residual gas discharge step, an unreacted gas not contributing to the formation of the group-III nitride crystal is discharged to the outside of the chamber.

Details of Method of Manufacturing Group-III Nitride Crystal with Specified Surface Carbon Concentration and Oxygen Concentration The details of the method of manufacturing a group-III nitride crystal according to the first embodiment will be described with reference to ae schematic cross-sectional view of an apparatus of FIG. 3.

In this description, liquid Ga is used as a starting group-III element source 105.

At the group-III element oxide gas generation step, first, a reactive gas is supplied from a reactive gas supply pipe 103. The supplied reactive gas reacts with Ga that is the starting group-III element source 105 to generate $Ga_2O$ gas that is a group-III oxide gas. The generated $Ga_2O$ gas is discharged from a raw material reaction chamber 101 via a group-III oxide gas discharge port 107 to a raw material chamber 100. The discharged $Ga_2O$ gas is mixed with a first carrier gas supplied from a first carrier gas supply port 102 to the raw material chamber and is supplied to a group-III oxide gas and a carrier gas discharge port 108.

In this case, a temperature of a first heater 106 is set to 800° C. or more from the viewpoint of the boiling point of the $Ga_2O$ gas and is set to less than 1800° C. to make the temperature lower than a second heater 115.

A starting Ga source is placed in a raw material container 104. The raw material container 104 preferably has a shape that can increase a contact area between the reactive gas and the starting Ga source.

Methods of generating the group-III oxide gas are roughly classified into a method of oxidizing the starting Ga source 105 and a method of reducing the starting Ga source 105.

For example, in the oxidizing method, a non-oxide (e.g., liquid Ga) is used as the starting Ga source 105, and an oxidizing gas (e.g., $H_2O$ gas, $O_2$ gas, CO gas, $CO_2$ gas) is used as the reactive gas. It is noted the $H_2$ gas is a reducing gas and may be used as the reactive gas only when the starting Ga source 105 is liquid Ga. In addition to the starting Ga source 105, an In (indium) source and an Al source can be employed as the starting group-III element. On the other hand, in the reducing method, an oxide (e.g., $Ga_2O_3$) is used as the starting Ga source 105, and a reducing gas (e.g., $H_2$ gas, CO gas, $CO_2$ gas, $CH_4$ gas, $C_2H_6$ gas, $H_2S$ gas, $SO_2$ gas) is used as the reactive gas.

For the first carrier gas, an inert gas or the $H_2$ gas can be used.

At the group-III element oxide gas supply step, the $Ga_2O$ gas generated at the group-III element oxide gas generation step is supplied through the group-III oxide gas and carrier gas discharge port 108, a connection pipe 109, a group-III oxide gas and carrier gas supply port 118 to a growth chamber 111. When the temperature of the connection pipe 109 connecting the raw material chamber 100 and the growth chamber 111 is lower than the temperature of the raw material chamber 100, a reverse reaction of the reaction for generating the group-III oxide gas occurs, and the starting Ga source 105 precipitates inside the connection pipe 109. Therefore, the connection pipe 109 is heated by a third heater 110 to a temperature higher than the first heater 106 so that the temperature of the connection pipe 109 does not become lower than the temperature of the raw material chamber 100. Additionally, the mixing of the oxygen element into the crystal can be controlled at this step. Specifically, if the oxygen concentration is made higher on the back-surface side or the inner-layer side and the oxygen concentration is made lower on the front-surface side, a supply amount of the group-III element oxide gas to the growth chamber 111 is increased when the inner layer is formed from an early stage of growth to a middle stage of growth. On the other hand, when the front-surface side is formed in a late stage of growth, the supply amount of the group-III element oxide gas to the growth chamber 111 is reduced. Furthermore, if the oxygen concentration is gradually changed from the back-surface side to the front-surface side, the supply amount of the group-III element oxide gas to the growth chamber 111 is changed without causing a lattice mismatch in the crystal. A specific control method of the group-III oxide gas is implemented by controlling the reactive gas supply amount of the reactive gas supply step supplied at the group-III oxide gas generation step with a mass flow controller.

At the nitrogen element-containing gas supply step, the nitrogen element-containing gas is supplied from a nitrogen element-containing gas supply port 112 to the growth chamber 111.

$NH_3$ gas, NO gas, $NO_2$ gas, $N_2H_2$ gas, $N_2H_4$ gas, HCN gas, etc. can be used as the nitrogen element-containing gas.

Figure 4:
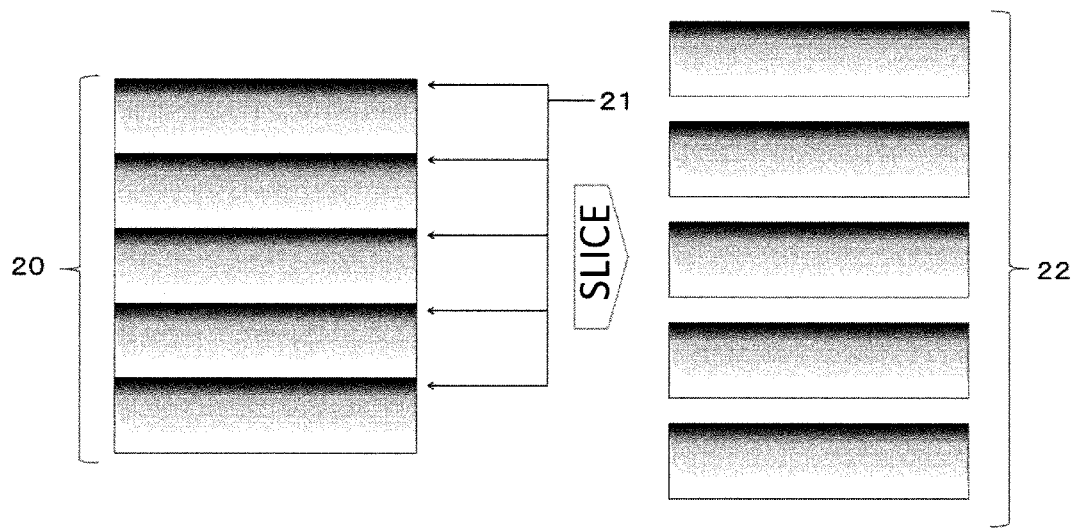
FIG. 4 is a schematic cross-sectional view of an example of a group-III nitride crystal according to the first embodiment.

At the carbon element-containing gas supply step, the carbon element-containing gas is supplied from a carbon element-containing gas supply port 113 to the growth chamber 111. By supplying the carbon element-containing gas, the mixing of the carbon element into the crystal can be controlled. Specifically, if the carbon element concentration is made lower on the back-surface side or the inner-layer side and the carbon element concentration is made higher on the front-surface side, a supply amount of the carbon element-containing gas to the growth chamber 111 is reduced when the inner layer is formed from the early stage of growth to the middle stage of growth. On the other hand, when the front-surface side is formed in the late stage of growth, the supply amount of the carbon element-containing gas to the growth chamber 111 is increased. Furthermore, if the carbon element concentration is gradually changed from the back-surface side to the front-surface side, the supply amount of the carbon element-containing gas to the growth chamber 111 is changed without causing a lattice mismatch in the crystal. If variations are made in carbon element concentration in the thickness direction as shown in FIG. 4, the supply amount of the carbon element-containing gas to the growth chamber 111 is changed without causing a lattice mismatch in regions located on front and back surfaces of substrates after slicing.

$CH_4$ gas, $C_2H_6$ gas, $C_3H_8$ gas, $C_4H_{10}$ gas, $C_2H_4$ gas, $C_3H_6$ gas, $C_4H_8$ gas, $C_2H_2$ gas, $C_3H_4$ gas, etc. are usable as the carbon element-containing gas from the viewpoint of reactivity with the oxide gas other than the Ga source. Regarding a supply concentration of the carbon element-containing gas, the gas is supplied into the growth chamber 111 at a flow rate in a range of 0.01 atm % to 30 atm % in consideration of the concentration control of carbon into the crystal.

At the group-III nitride crystal generation step, the raw material gases supplied through the supply steps into the growth chamber are combined to manufacture a group-III nitride crystal.

The growth chamber 111 is heated by the second heater 115 to a temperature at which the group-III oxide gas reacts with the nitrogen element-containing gas. In this case, the growth chamber 111 is heated so that the temperature of the growth chamber 111 does not become lower than the temperature of the raw material chamber 100 to suppress the reverse reaction of the reaction for generating the group-III oxide gas. When the group-III nitride crystal is grown, it is necessary to reduce impurities (silicon, chlorine, hydrogen, sodium, magnesium, aluminum, titanium, chromium, iron, nickel, molybdenum, tantalum, etc.) and to suppress decomposition of the group-III nitride crystal. Additionally, the second heater 115 and the third heater 110 are set to the same temperature for a reason of suppression of temperature fluctuation of the growth chamber 111 due to the $Ga_2O$ gas generated in the raw material chamber 100 and the first carrier gas. Therefore, the temperature of the second heater 115 is set to 1000° C. to 1800° C.

By mixing the group-III oxide gas supplied to the growth chamber 111 through the group-III element oxide gas supply step and the nitrogen element-containing gas supplied to the growth chamber 111 through the nitrogen element-containing gas supply step upstream of a seed substrate 116, the group-III nitride crystal can be grown on the seed substrate 116.

In this case, to suppress decomposition of the nitrogen element-containing gas due to heat from the growth chamber 111, the nitrogen element-containing gas supply port 112 and an outer wall of the growth chamber 111 are preferably covered with a heat insulator.

Parasitic growth of the group-III nitride crystal onto a furnace wall of the growth chamber 111 and a substrate susceptor 117 is considered as a problem. Therefore, the concentrations of the group-III oxide gas and the nitrogen element-containing gas can be controlled by the carrier gas supplied from a second carrier gas supply port 114 to the growth chamber 111 to suppress the parasitic growth of the group-III nitride crystal to the furnace wall of the growth chamber 111 and the substrate susceptor 117.

For the seed substrate 116, for example, gallium nitride, gallium arsenide, silicon, sapphire, silicon carbide, zinc oxide, gallium oxide, or $ScAlMgO_4$ can be used.

An inert gas or the $H_2$ gas can be used as a second carrier gas.

For the formation of the group-III nitride crystal, a large number of group-III nitride substrates are preferably cut out from one crystal growth. Therefore, as shown in FIG. 4, a group-III nitride ingot 20 repeatedly including high concentration carbon layers 21 are preferably produced and then sliced in regions of the high concentration carbon layers 21 to cut out a large number of group-III nitride substrates 22. One substrate may be produced from one growth without producing an ingot.

The group-III nitride ingot 20 comprising repeating multiple high concentration carbon layers 21 of FIG. 4 as described above can be formed by, for example, repeating a carbon element-containing gas supply cycle including a supply of a low concentration carbon element-containing gas and a supply of a high concentration carbon element-containing gas.

The unreacted group-III oxide gas, nitrogen element-containing gas, carbon element-containing gas, and carrier gas are discharged from an exhaust port 119. In this case, an oxide gas may be generated by reacting the carbon element-containing gas with a substance present in the growth chamber and containing oxygen other than the group-III element oxide gas. Furthermore, the oxide gas may be discharged to the outside of the growth chamber.

Example 1

Figure 3:
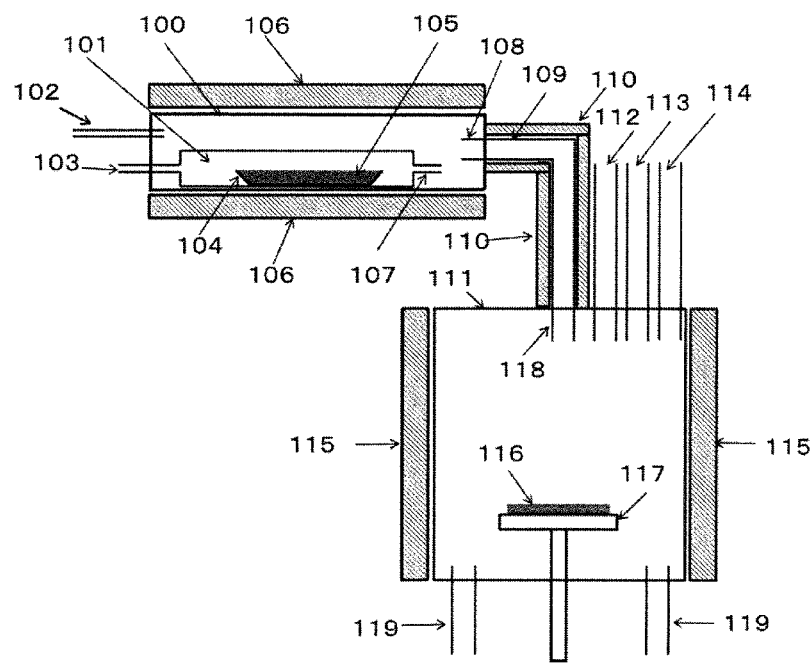
FIG. 3 is a schematic cross-sectional view of a group-III nitride crystal manufacturing apparatus according to the first embodiment.

A group-III nitride crystal was grown by using the growth furnace shown in FIG. 3. GaN was grown as the group-III nitride crystal. $Ga_2O_3$ powder was used as a starting Ga source, $Ga_2O_3$ was reacted with the $H_2$ gas that is a reactive gas, and the $Ga_2O$ gas was used as a Ga source gas. The $NH_3$ gas was used as an N source. The $H_2$ gas and the $N_2$ gas were used as carrier gases. The $CH_4$ gas was used as a carbon element-containing gas. Main crystal growth conditions are as follows. A partial pressure of each gas in this case is a partial pressure of each gas at the time of supply into a chamber. The growth was entirely conducted in the atmosphere under the atmospheric pressure.

Growth Conditions of Base Material Part

Growth temperature: 1200° C., Raw material temperature: 1100° C., $NH_3$ partial pressure: 0.04 atm, $H_2$ partial pressure: 0.89 atm, $CH_4$ partial pressure: 0.01 atm Growth Conditions of Front Surface of Base Material Part Growth temperature: 1200° C., Raw material temperature: 1100° C., $NH_3$ partial pressure: 0.04 atm, $H_2$ partial pressure: 0.84 atm, $CH_4$ partial pressure: 0.07 atm The growth conditions of the base material part were gradually changed to the growth conditions of the front surface of the base material part within a range of a degree of lattice mismatch of 0.01% or less. The concentration of carbon mixed into the crystal was changed by controlling the $CH_4$ partial pressure, and the concentration of oxygen was controlled through the partial pressure of the $H_2$ gas that is a reactive gas contributing to generation of the group-III oxide gas.

Various characteristics of the crystal grown under these growth conditions are shown below. Evaluations were made on the grown crystal having the base material part of 400 µm in thickness and the front surface of the base material part of 40 µm in thickness. Regarding the evaluations, the electrical characteristics were evaluated by Hall effect measurement, and the lattice constant was estimated by X-ray diffraction (XRD) measurement. Furthermore, respective carbon concentrations and oxygen concentrations were quantified by secondary ion mass spectrometry (SIMS). For reference, lattice constants of a GaN crystal produced by the MOCVD method used for device layer formation are also described.

Evaluation Results of Base Material Part

Electrical conductivity: $1.2 \times 10^3 \Omega^{-1} \cdot cm^{-1}$, a-axis lattice constant: 3.1887 Å (31.887 nm), c-axis lattice constant: 5.1863 Å, Carbon concentration: $2 \times 10^{17}$ cm$^{-3}$, Oxygen concentration: $5 \times 10^{20}$ cm$^{-3}$ Evaluation Results of Front Surface of Base Material Part Electrical conductivity: $2.1 \times 10^2 \Omega^{-1} \cdot cm^{-1}$, a-axis lattice constant: 3.1871 Å, c-axis lattice constant: 5.1846 Å, Carbon concentration: $5 \times 10^{20}$ cm$^{-3}$, Oxygen concentration: $3 \times 10^{20}$ cm$^{-3}$ Evaluation Results of Lattice Constants of GaN Crystal Grown by MOCVD Method a-axis lattice constant: 3.1874 Å, c-axis lattice constant: 5.1844 Å

Comparative Example 1

A crystal was grown under the same conditions as the base material part of Example 1 except that the supply of the $CH_4$ gas was eliminated.

Evaluation Results of Comparative Example

Electrical conductivity: $1.3 \times 10^3 \Omega^{-1} \cdot cm^{-1}$, a-axis lattice constant: 3.1889 Å, c-axis lattice constant: 5.1848 Å, Carbon concentration: $7 \times 10^{15}$ cm$^{-3}$, Oxygen concentration: $5 \times 10^{20}$ cm$^{-3}$ In the comparative example, the growth conditions are not changed in the back surface and the inner layer of the base material part from the front surface of the base material part, and therefore, the electrical conductivity, the lattice constant, and the impurity concentration have the same values as in the base material part and the front surface of the base material part.

From the above results, the lattice constant of the front surface of the base material part grown by using the $CH_4$ gas had degrees of lattice mismatch of 0.009% and 0.004% for the a-axis and the c-axis, respectively, with the lattice constant of the crystal grown by the MOCVD method used as the device layer. On the other hand, the lattice constant of the crystal of the comparative example grown without using $CH_4$ had degrees of lattice mismatch of 0.047% and 0.008% for the a-axis and the c-axis, respectively, with the lattice constant of the GaN crystal grown by the MOCVD method. Generally, the degree of lattice mismatch must be 0.01% or less so as not to cause dislocation defects or cracking in the device layer, and it can be concluded that the effect of addition of $CH_4$ is sufficient. The oxygen concentration is preferably $1 \times 10^{21}$ cm$^{-3}$ or less from the viewpoint of ensuring crystallinity. On the other hand, the oxygen concentration is preferably $1 \times 10^{20}$ cm$^{-3}$ or more from the viewpoint of improving electrical conductivity.

Figure 6:
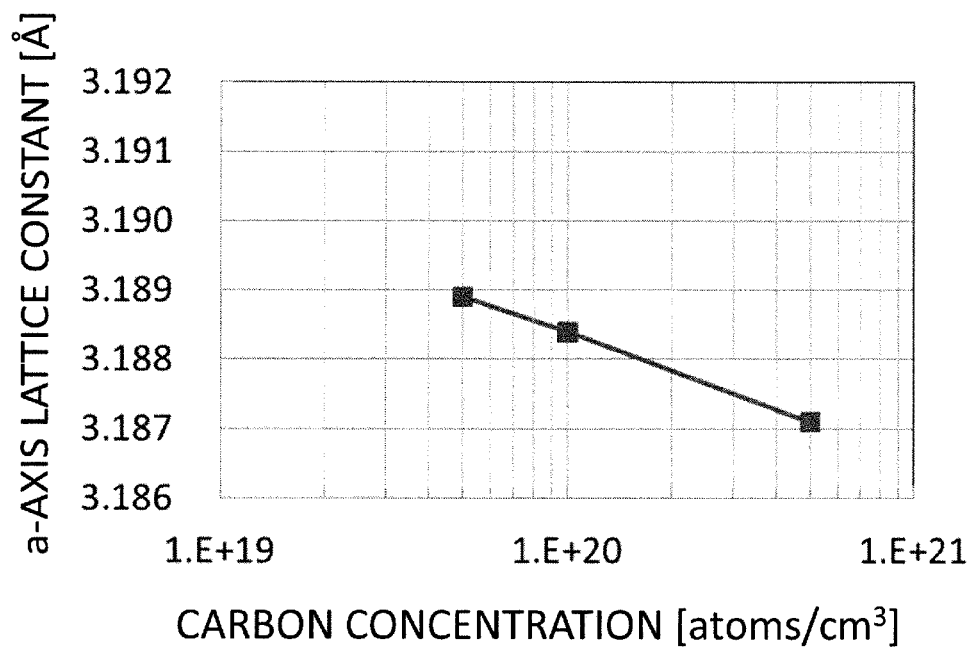
FIG. 6 is a graph showing the carbon concentration and the a-axis lattice constant of the group-III nitride substrate.

Relationship Between Carbon Concentration in Crystal and A-Axis Lattice Constant FIG. 6 shows a graph of experimental results of an example representative of a relationship between the carbon concentration in the crystal and the a-axis lattice constant. This experiment was conducted under the following typical growth conditions. The crystals grown and evaluated in this experiment were crystals with high oxygen concentration of $1 \times 10^{20}$ cm$^{-3}$ to $5 \times 10^{20}$ cm$^{-3}$.

Growth temperature: 1200° C., Raw material temperature: 1100° C., $NH_3$ partial pressure: 0.04 atm, $H_2$ partial pressure: 0.8 to 0.9 atm, $CH_4$ partial pressure: 0.01 to 0.06 atm The crystal with the lowest carbon concentration in this verification range (carbon concentration: $5 \times 10^{19}$ cm$^3$) had the a-axis lattice constant of 3.1889 Å and the oxygen concentration of $1 \times 10^{20}$ cm$^{-3}$. The crystal with the carbon concentration of $1 \times 10^{20}$ cm$^{-3}$ had the a-axis lattice constant of 3.1884 Å and the oxygen concentration of $2 \times 10^{20}$ cm$^{-3}$. The crystal with the carbon concentration of $5 \times 10^{20}$ cm$^{-3}$ had the a-axis lattice constant of 3.18871 Å and the oxygen concentration of $5 \times 10^{20}$ cm$^{-3}$. It is generally known that a lattice constant in a crystal is enlarged when only the oxygen element is mixed at a high concentration. On the other hand, the carbon concentration is also increased at the same time in this verification, so that the lattice constant tends to decrease. Although this verification indicates that, between the oxygen element and the carbon element, the carbon element has higher sensitivity to the lattice constant than the oxygen element, it is thought that this suggestion has room for further verification.

From this result, in consideration of lattice match with device layers and seed substrates produced by different techniques such as the MOCVD method and the HVPE method (a-axis lattice constants of typical GaN crystals produced by the MOCVD method and the HVPE method are 3.187 to 3.188 Å), the carbon concentration of the front surface of the base material part is preferably $1.5 \times 10^{20}$ atoms/cm$^3$ to $5 \times 10^{20}$ atoms/cm$^3$. On the other hand, the carbon concentration on the inner-layer side of the base material part is preferably $1 \times 10^{17}$ atoms/cm$^3$ or more for a reason of suppression of abnormal growth and suppression of polycrystallization and is desirably $5 \times 10^{20}$ atoms/cm$^3$ or less for a reason of suppression of pits generated in a growth process and suppression of a decrease in electrical conductivity.

Additionally, the oxygen concentration of the front surface of the base material part and on the inner-layer side of the base material part is preferably $1 \times 10^{20}$ atoms/cm$^3$ or more for a reason of improvement in electrical conductivity and is preferably $1 \times 10^{21}$ atoms/cm$^3$ or less for a reason of ensuring crystallinity. Furthermore, in consideration of lattice match with a device layer formed on the front surface of the base material part, the oxygen concentration of the front surface of the base material part is preferably lower than that of the inner layer of the base material part. It is generally known that a lattice constant in a crystal is enlarged when only the oxygen element is mixed at a high concentration.

Figure 5:
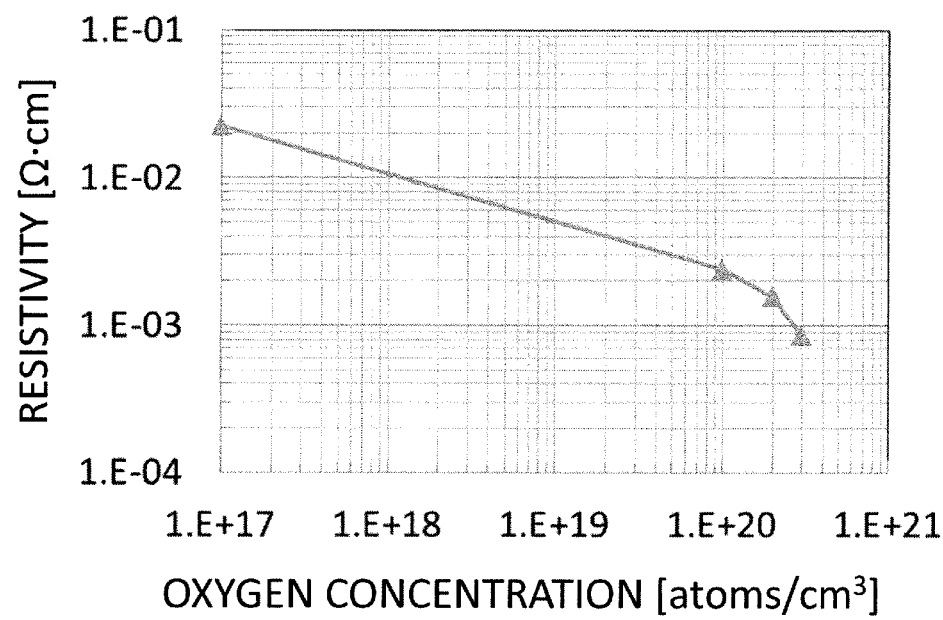
FIG. 5 is a graph showing the oxygen concentration and the resistivity of the group-III nitride substrate.

Relationship Between Oxygen Concentration in Crystal and Electrical Conductivity FIG. 5 shows a graph of experimental results of an example representative of a relationship between the oxygen concentration in the crystal and the electrical conductivity. The oxygen concentration of a front surface portion of the base material part is preferably $1 \times 10^{20}$ atoms/cm$^3$ or more from the viewpoint of improvement in electrical conductivity. Similarly, from the viewpoint of improvement in electrical conductivity, the oxygen concentration of the base material part is preferably $1 \times 10^{20}$ atoms/cm$^3$ or more. By setting the oxygen concentration to $1 \times 10^{20}$ atoms/cm$^3$ or more, the resistivity can be reduced to $\frac{1}{10}$ or less as compared to general commercial GaN substrates (oxygen concentration: $1 \times 10^{17}$ atoms/cm$^3$ or less). On the other hand, from the viewpoint of ensuring crystallinity, the oxygen concentration is preferably $1 \times 10^{21}$ atoms/cm$^3$ or less, and additionally, although variations in the oxygen concentration between a front surface layer and an inner layer differ depending on an amount of the carbon element to be mixed, the oxygen concentration is preferably lower in the front surface layer as compared to the inner layer of the base material part so as to control the lattice constant of the front surface.

Furthermore, regarding the adjustment of the lattice constant according to a change in carbon concentration from the inner layer of the base material part to the front surface of the base material part, from the viewpoint of suppression of the growth of dislocation defects and the occurrence of cracking from the inner layer of the base material part to the front surface of the base material part, a flow rate of the CH$_4$ gas is desirably gradually changed to a higher concentration with respect to a film thickness. The phrase "gradually changed" means that the change is made preferably within a range of film thickness of 1 to 10 μm from the viewpoint of reducing a lattice constant difference from the inner layer of the base material part to the front surface of the base material part. Furthermore, the change is made more preferably within a range of 10 to 50 μm, further preferably within a range of 50 to 100 μm.

In addition to [atoms/cm$^3$], simply [cm$^{-3}$] without "atoms" is used as a unit of carbon concentration and oxygen concentration in some cases, and both have the same meaning.

The present disclosure includes appropriately combining arbitrary embodiments and/or examples out of the various embodiments and/or examples described above, and the effects of the respective embodiments and/or examples can be produced.

As described above, the group-III nitride substrate and the method of manufacturing the group-III nitride substrate according to the present invention can achieve both the resistance reduction and the lattice constant control of the group-III nitride substrate. Therefore, the present invention is useful for device layer formation in which propagation of dislocation defects and occurrence of cracking are suppressed.

EXPLANATIONS OF LETTERS OR NUMERALS 1 base material part
2 front surface
3 back surface
10 group-III nitride substrate
20 group-III nitride ingot
21 high concentration carbon-containing layer
22 large number of group-III nitride substrates
100 raw material chamber
101 raw material reaction chamber
102 first carrier gas supply port
103 reactive gas supply pipe
104 raw material container
105 starting group-III element source
106 first heater
107 group-III oxide gas discharge port
108 group-III oxide gas and carrier gas discharge port
109 connection pipe
110 third heater
111 growth chamber
112 nitrogen element-containing gas supply port
113 carbon element-containing gas supply port
114 second carrier gas supply port
115 second heater
116 seed substrate
117 substrate susceptor
118 group-III oxide gas and carrier gas supply port
119 exhaust port 120 group-III element metal supply pipe
121 group-III element metal filling tank

What is claimed is:

1. A group-III nitride substrate comprising: a base material part of a group-III nitride including a front surface, a back surface, and an inner layer between the front surface and the back surface,
wherein a carbon concentration of a front surface region of the base material part is higher than a carbon concentration of the inner layer, the front surface region being a region from the front surface to a depth of 40 µm, and the inner layer being a region from the depth of 40 µm to the back surface,
the oxygen concentration of the base material part is $1 \times 10^{20}$ [atoms/cm$^3$] or more, and
the carbon concentration of the base material part is $5 \times 10^{20}$ [atoms/cm$^3$] or less.

2. The group-III nitride substrate according to claim 1, wherein the front surface of the base material part is a surface for growing a group-III nitride crystal thereon.

3. The group-III nitride substrate according to claim 1, wherein an oxygen concentration of the front surface region of the base material part is lower than an oxygen concentration of the inner layer.

4. The group-III nitride substrate according to claim 2, wherein the front surface of the base material part is a +c surface, and wherein the back surface of the base material part is a −c surface.

5. The group-III nitride substrate according to claim 3, wherein:
the carbon concentration of the front surface region of the base material part is $5 \times 10^{19}$ [atoms/cm$^3$] or more.

6. The group-III nitride substrate according to claim 5, wherein:
the carbon concentration of the front surface region of the base material part is within a range of $1.5 \times 10^{20}$ to $1 \times 10^{20}$ [atoms/cm$^3$], and
the oxygen concentration of the front surface region of the base material part is in the range of $1 \times 10^{20}$ to $1 \times 10^{21}$ [atoms/cm$^3$].

7. The group-III nitride substrate according to claim 3, wherein:
the oxygen concentration of the base material part is within a range of $1 \times 10^{20}$ to $1 \times 10^{21}$ [atoms/cm$^3$], and
the carbon concentration of the base material part is within a range of $1 \times 10^{17}$ to $5 \times 10^{20}$ [atoms/cm$^3$].

8. The group-III nitride substrate according to claim 1, wherein the carbon concentration in the base material part gradually changes along a thickness direction from the front surface to the back surface.

9. The group-III nitride substrate according to claim 3, wherein the oxygen concentration in the base material part gradually changes along the thickness direction from the front surface to the back surface.

10. A group-III nitride substrate comprising:
a seed substrate; and
a base material part of a group-III nitride disposed on the seed substrate, and including a front surface, a back surface, and an inner layer between the front surface and the back surface in contact with the seed substrate,
wherein a carbon concentration of a front surface region of the base material part is higher than a carbon concentration of the inner layer, the front surface region being a region from the front surface to a depth of 40 µm, and the inner layer being a region from the depth of 40 µm to the back surface,
the oxygen concentration of the base material part is $1 \times 10^{20}$ [atoms/cm$^3$] or more, and
the carbon concentration of the base material part is $5 \times 10^{20}$ [atoms/cm$^3$] or less.

11. The group-III nitride substrate according to claim 10, wherein the front surface of the base material part is a surface for growing a group-III nitride crystal thereon.

12. The group-III nitride substrate according to claim 10, wherein an oxygen concentration of the front surface region of the base material part is lower than an oxygen concentration of the inner layer.

13. The group-III nitride substrate according to claim 10, wherein the front surface of the base material part is a +c surface, and wherein the back surface of the base material part is a −c surface.

14. The group-III nitride substrate according to claim 12, wherein:
the carbon concentration of the front surface region of the base material part is $5 \times 10^{19}$ [atoms/cm$^3$] or more.

15. The group-III nitride substrate according to claim 14, wherein:
the carbon concentration of the front surface region of the base material part is within a range of $1.5 \times 10^{20}$ to $5 \times 10^{20}$ [atoms/cm$^3$], and
the oxygen concentration of the front surface region of the base material part is in the range of $1 \times 10^{20}$ to $1 \times 10^{21}$ [atoms/cm$^3$].

16. The group-III nitride substrate according to claim 14, wherein:
the oxygen concentration of the base material part is within a range of $1 \times 10^{20}$ to $1 \times 10^{21}$ [atoms/cm$^3$], and
the carbon concentration of the base material part is within a range of $1 \times 10^{17}$ to $5 \times 10^{20}$ [atoms/cm$^3$].

17. The group-III nitride substrate according to claim 10, wherein the carbon concentration in the base material part gradually changes along a thickness direction from the front surface to the back surface.

18. The group-III nitride substrate according to claim 12, wherein the oxygen concentration in the base material part gradually changes along the thickness direction from the front surface to the back surface.

* * * * *